US009045826B2

(12) United States Patent
Seo et al.

(10) Patent No.: US 9,045,826 B2
(45) Date of Patent: Jun. 2, 2015

(54) THIN FILM DEPOSITION APPARATUS AND THIN FILM DEPOSITION METHOD USING THE SAME

(75) Inventors: Sang-Joon Seo, Yongin (KR);
Myung-Soo Huh, Yongin (KR);
Seung-Hun Kim, Yongin (KR);
Jin-Kwang Kim, Yongin (KR);
Cheol-Rae Jo, Yongin (KR); Choel-Min Jang, Yongin (KR); Jeong-Ho Yi, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/613,804

(22) Filed: Sep. 13, 2012

(65) Prior Publication Data
US 2013/0266728 A1 Oct. 10, 2013

(30) Foreign Application Priority Data

Apr. 6, 2012 (KR) .................. 10-2012-0036259

(51) Int. Cl.
*C23C 16/455* (2006.01)

(52) U.S. Cl.
CPC ............................. *C23C 16/45551* (2013.01)

(58) Field of Classification Search
CPC .............. C23C 16/455; C23C 16/4523; C23C 16/45525; C23C 16/45548; C23C 16/45551; C23C 16/45587; C23C 16/45589
USPC .................... 118/715; 156/345.33, 345.34
See application file for complete search history.

(56) References Cited

U.S. PATENT DOCUMENTS

| 5,445,699 | A | * | 8/1995 | Kamikawa et al. ...... 156/345.24 |
| 6,063,714 | A | | 5/2000 | Smith et al. |
| 6,350,316 | B1 | * | 2/2002 | Hayashi et al. ................. 118/52 |
| 6,555,161 | B1 | | 4/2003 | Clough |
| 6,576,913 | B2 | * | 6/2003 | Koyama ................... 250/492.21 |
| 6,583,071 | B1 | * | 6/2003 | Weidman et al. ............. 438/787 |
| 7,699,932 | B2 | * | 4/2010 | Miller et al. .................. 118/715 |
| 7,752,999 | B2 | * | 7/2010 | Nakashima et al. .......... 118/712 |
| 7,820,243 | B2 | * | 10/2010 | Yoshihara et al. ............ 427/240 |
| 8,303,713 | B2 | * | 11/2012 | Belousov et al. ............. 118/715 |
| 8,568,554 | B2 | * | 10/2013 | Hayashi .................. 156/345.33 |
| 8,735,188 | B2 | * | 5/2014 | Kim et al. ....................... 438/26 |

(Continued)

FOREIGN PATENT DOCUMENTS

| KR | 10-2005-0099763 A | 10/2005 |
| KR | 10-2010-0077444 A | 7/2010 |

(Continued)

*Primary Examiner* — Jeffrie R Lund
(74) *Attorney, Agent, or Firm* — Robert E. Bushnell, Esq.

(57) ABSTRACT

In a thin film deposition apparatus and a thin film deposition method using the same, a first spraying unit and a second spraying unit which are separately driven are prepared, the first spraying unit is driven to sequentially spray a first deposition source and an inert gas onto a substrate, a chamber is exhausted to remove, from the chamber, excess first deposition sources that are not adsorbed onto the substrate from the chamber, a second spraying unit is driven to sequentially spray a second deposition source and an inert gas onto the substrate, and the chamber is exhausted to remove, from the chamber, excess second deposition sources that are not adsorbed onto the substrate. When the thin film deposition method is used, the unintended generation of microparticles during deposition is sufficiently suppressed.

7 Claims, 5 Drawing Sheets

(56) References Cited

U.S. PATENT DOCUMENTS

| | | |
|---|---|---|
| 2004/0134427 A1 | 7/2004 | Derderian et al. |
| 2004/0144309 A1* | 7/2004 | Yudovsky .................. 118/715 |
| 2005/0034662 A1* | 2/2005 | Ahn ........................... 118/715 |
| 2005/0133616 A1* | 6/2005 | Shimoda et al. ............ 239/135 |
| 2005/0175775 A1* | 8/2005 | Shirley ........................ 427/240 |
| 2006/0000411 A1* | 1/2006 | Seo et al. .................... 118/715 |
| 2006/0065635 A1 | 3/2006 | Derderian et al. |
| 2007/0095286 A1* | 5/2007 | Baek et al. .................. 118/719 |
| 2007/0098901 A1* | 5/2007 | Terada et al. ................ 427/335 |
| 2008/0118629 A1* | 5/2008 | Shimoda et al. .................. 427/8 |
| 2009/0011595 A1* | 1/2009 | Seo et al. .................... 438/680 |
| 2009/0087559 A1* | 4/2009 | Yoshihara et al. ........... 427/240 |
| 2009/0220374 A1 | 9/2009 | Ma et al. |
| 2009/0258152 A1* | 10/2009 | Miyamoto .................. 427/427.3 |
| 2010/0032388 A1* | 2/2010 | Ralvert ........................ 210/797 |
| 2010/0043975 A1* | 2/2010 | Hayashi .................. 156/345.33 |
| 2010/0116209 A1* | 5/2010 | Kato ........................... 118/730 |
| 2010/0132614 A1* | 6/2010 | Kato et al. ................ 118/723 R |
| 2011/0146572 A1* | 6/2011 | Yoshihara et al. ............ 118/697 |
| 2011/0256726 A1 | 10/2011 | LaVoie et al. |
| 2011/0293831 A1* | 12/2011 | Sferlazzo .................. 427/255.28 |
| 2012/0003396 A1* | 1/2012 | Maas et al. .................... 427/569 |
| 2012/0028454 A1 | 2/2012 | Swaminathan et al. |
| 2012/0225204 A1* | 9/2012 | Yudovsky .................. 427/248.1 |
| 2012/0301616 A1* | 11/2012 | Endo et al. ................. 427/255.7 |
| 2013/0071567 A1* | 3/2013 | Hsiao et al. ............... 427/255.28 |
| 2013/0072000 A1* | 3/2013 | Hsiao et al. ................... 438/478 |
| 2013/0239887 A1* | 9/2013 | Yoshihara et al. ............ 118/697 |
| 2013/0266728 A1* | 10/2013 | Seo et al. .................. 427/255.28 |
| 2013/0270362 A1* | 10/2013 | Sferlazzo et al. ........... 239/225.1 |
| 2013/0312659 A1* | 11/2013 | Inatomi ........................... 118/66 |
| 2013/0323422 A1* | 12/2013 | Peidous .................... 427/255.7 |
| 2014/0011342 A1* | 1/2014 | Kapur et al. .................... 438/478 |

FOREIGN PATENT DOCUMENTS

| | | |
|---|---|---|
| KR | 10-2010-0077829 A | 7/2010 |
| KR | 10-2011-0042588 A | 4/2011 |

* cited by examiner

THIN FILM DEPOSITION APPARATUS AND THIN FILM DEPOSITION METHOD USING THE SAME

CLAIM OF PRIORITY

This application makes reference to, incorporates the same herein, and claims all benefits accruing under 35 U.S.C. §119 from an application earlier filed in the Korean Intellectual Property Office on the $6^{th}$ of Apr. 2012 and there duly assigned Serial No. 10-2012-0036259.

BACKGROUND OF THE INVENTION

1. Field of the Invention

The present invention relates to a thin film deposition apparatus for depositing a deposition source vapor onto a surface of a structure on which deposition is to be performed, and in particular, the present invention relates to a thin film deposition apparatus that is suitable for an atomic layer deposition (ALD) process in which a precursor and a reactant are sequentially provided to form a thin film, and a thin film deposition method using the same.

2. Description of the Related Art

As a thin film formation process, such as (for example) a thin film encapsulation process of an organic light-emitting display apparatus, for example, a deposition process in which a deposition source vapor is formed, and then the deposition source vapor is attached to the surface of a substrate, is often used.

Recently, an atomic layer deposition (ALD) process which enables accurate formation of a uniform thin film is preferably used. Regarding the ALD process, a precursor is adsorbed onto the surface of a substrate, and then, a reactant is supplied thereto, and due to the reaction between the precursor and the reactant, an atomic layer is formed However, if the reactant is supplied when the precursor is incompletely chemically adsorbed onto the surface of the substrate, a precursor which is not adsorbed also reacts with the reactant, thereby generating a plurality of microparticles. In this case, due to mixing with the microparticles, it is difficult to accurately form a thin film. Accordingly, measures for resolving this problem are required.

SUMMARY OF THE INVENTION

The present invention provides a thin film deposition apparatus that is improved so as to suppress unintended generation of microparticles during deposition, and a thin film deposition method using the same.

According to an aspect of the present invention, a thin film deposition apparatus includes: a chamber in which a substrate is placed; a first spraying unit for spraying a first deposition source onto the substrate; and a second spraying unit for spraying a second deposition source onto the substrate; wherein the first spraying unit and the second spraying unit are separately driven in the chamber.

Each of the first spraying unit and the second spraying unit may include a gas spraying unit for spraying an inert gas onto the substrate.

The first spraying unit and the second spraying unit may scan the substrate during deposition, wherein a scanning direction of the first spraying unit and a scanning direction of the second spraying unit run across each other.

Any one of the first spraying unit and the second spraying unit may include a pair of units facing each other.

During deposition, one of the first spraying unit and the second spraying unit may move above the substrate while scanning, and the other one may be fixed.

Among the first spraying unit and the second spraying unit, a unit that moves while scanning may include a pair of units facing each other.

The thin film deposition apparatus may further include an exhaustion unit for exhausting the interior of the chamber.

The first deposition source may include a precursor, and the second deposition source may comprise a reactant.

According to another aspect of the present invention, a thin film deposition method includes: a preparation process for preparing a chamber in which a substrate is placed so that a first spraying unit can spray a first deposition source and an inert gas onto the substrate, and so that a second spraying unit can be separately driven from the first spraying unit and can spray a second deposition source and an inert gas onto the substrate; a first deposition process in which the first spraying unit is driven so as to sequentially spray the first deposition source and the inert gas onto the substrate; a first exhaustion process in which the chamber is exhausted to remove excess first deposition sources that are not adsorbed onto the substrate; a second deposition process in which the second spraying unit is driven so as to sequentially spray the second deposition source and the inert gas onto the substrate; and a second exhaustion process in which the chamber is exhausted so as to remove excess second deposition sources that are not adsorbed onto the substrate.

In the first deposition process, the first spraying unit may scan the substrate along a first direction, and in the second deposition process, the second spraying unit may scan the substrate along a second direction which runs across the first direction.

In the first deposition process, the first spraying unit may perform a deposition process while scanning the substrate, and in the second deposition process, the second spraying unit may perform a deposition process while being fixed.

The thin film deposition method may further include selecting a deposition mode of the first deposition source and the second deposition source from a full mode or a half mode so as to set spraying amounts of deposition sources.

The first deposition source may include a precursor, and the second deposition source may include a reactant.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, embodiments of the present invention are described in detail below with reference to the attached drawings.

Figure 1A:
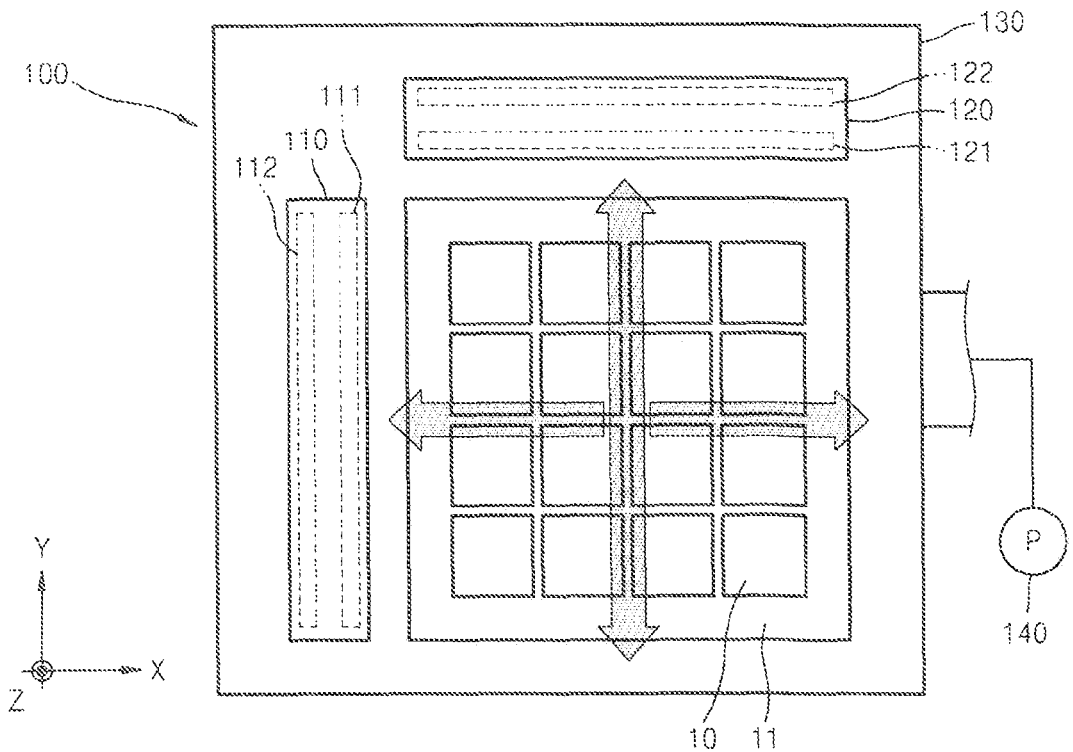
FIGS. 1A and 1B are views of a thin film deposition apparatus according to a first embodiment of the present invention.
Figure 1B:
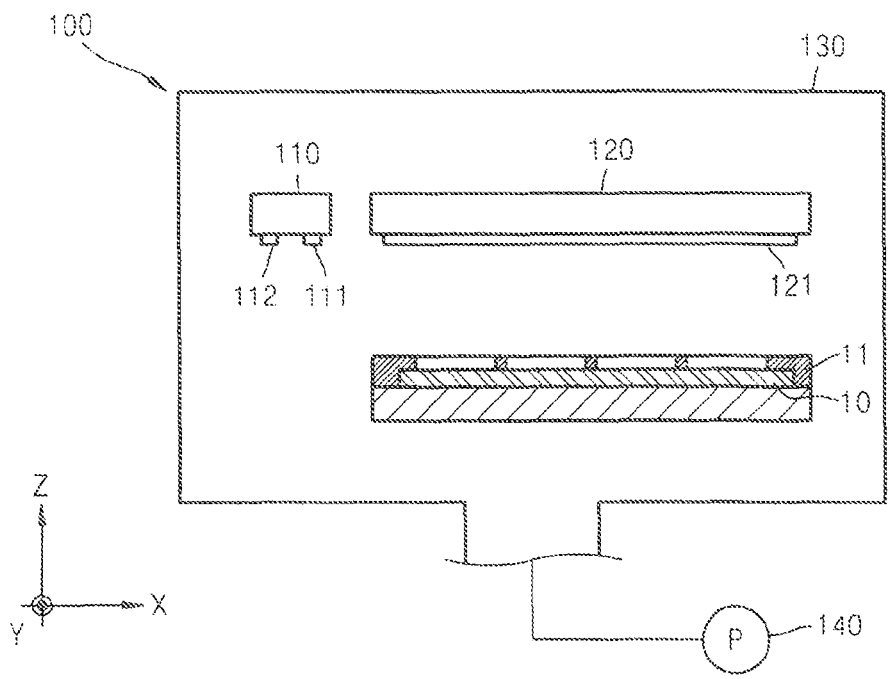
Figure 5:
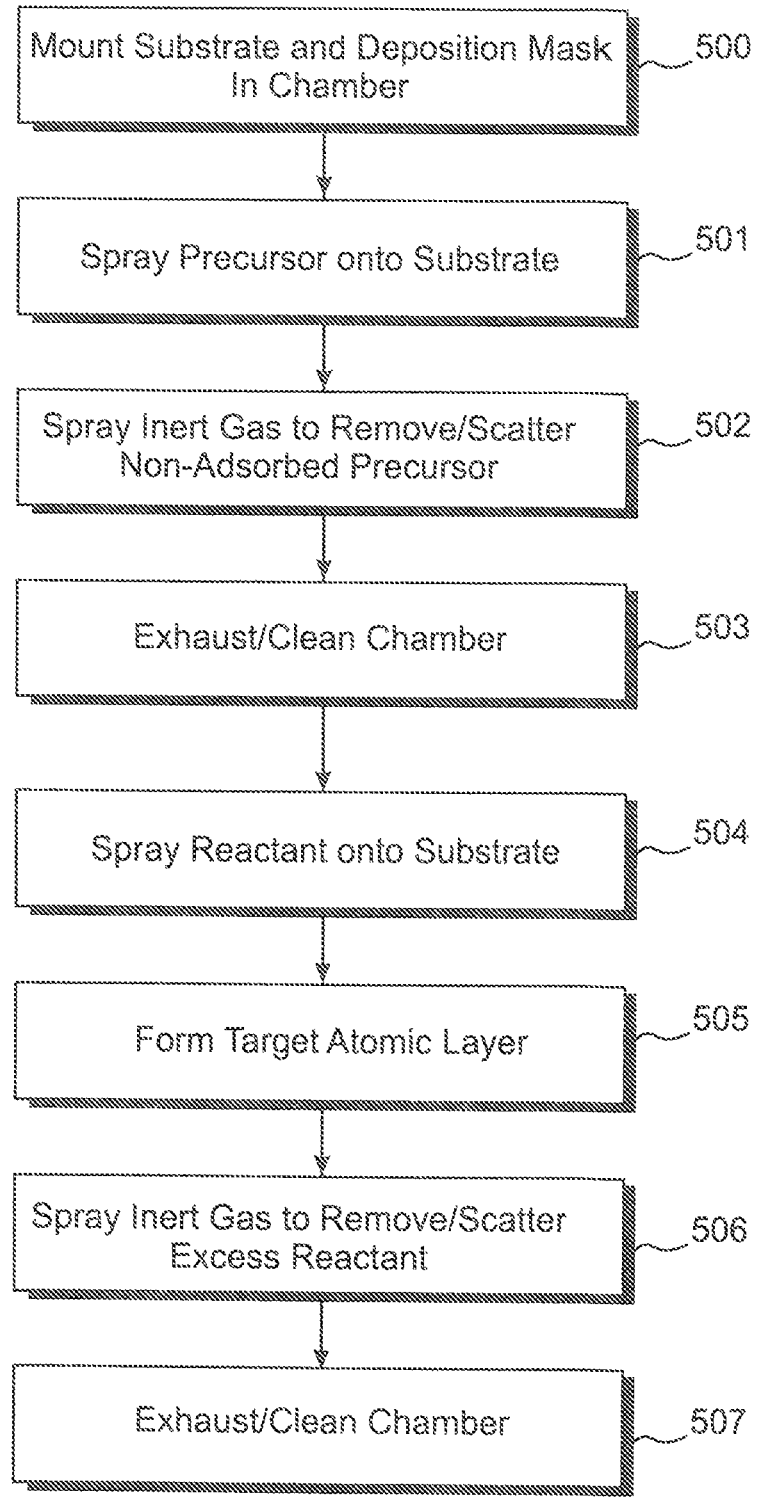
FIG. 5 is a flowchart of a process performed in accordance with the present invention.

FIGS. 1A and 1B are views of a thin film deposition apparatus according to a first embodiment of the present invention, and FIG. 5 is a flowchart of a process performed in accordance with the present invention.

Specifically, FIG. 1A is a schematic plan view of the thin film deposition apparatus, and FIG. 1B is a schematic front view of the thin film deposition apparatus.

As illustrated in FIGS. 1A and 1B, the thin film deposition apparatus 100 according to the present embodiment includes a chamber 130 in which a substrate 10, on which deposition is to be performed, is fixed in place, first and second spraying units 110 and 120, respectively, that spray a deposition source while scan-moving above the substrate 10 in the chamber 130, and an exhaustion unit 140 that exhausts the interior of the chamber 130, etc.

In this regard, the first spraying unit 110 and the second spraying unit 120 are separated from each other, wherein each of the first and second spraying units 110 and 120, respectively, independently performs its scanning operation, and scanning directions thereof run across each other. That is, the first spraying unit 110 scans the substrate 10 while moving back and forth along an X-axis direction, and the second spraying unit 120 scans the substrate 10 while moving back and forth along a Y-axis direction. Also, during scanning, the first spraying unit 110 sprays a precursor, which is a first deposition source, onto the substrate 10, and the second spraying unit 120 sprays a reactant, which is a second deposition source, onto the substrate 10. That is, a precursor and a reactant which are used for atomic layer deposition (ALD) are separately sprayed by using the first spraying unit 110 and the second spraying unit 120, respectively, which are separately driven. An operating method thereof is described below.

Reference numerals 111 and 121 respectively denote a source spraying unit for spraying a precursor, which is a deposition source, and a source spraying unit for spraying a reactant, and reference numerals 112 and 122 each denote a gas spraying unit for spraying an inert gas, such as argon (Ar). Also, the reference numeral 11 denotes a deposition mask.

Referring to FIG. 5, the thin film deposition apparatus 100 may be operated as follows.

First, the substrate 10 is mounted together with the deposition mask 11 in the chamber 130 (block 500).

When the substrate 10 is completely mounted, the first and second spraying units 110 and 120, respectively, are driven. In this case, the first and second spraying units 110 and 120, respectively, alternatively scan in crossing directions, and as soon as one spraying unit selected from the first and second spraying units 110 and 120, respectively, completely performs deposition and exhaustion processes, the other one begins a deposition process.

That is, first, while the first spraying unit 110 moves in the X direction, a precursor as a deposition source is sprayed onto the substrate 10 through the source spraying unit 111 (block 501). Then, the sprayed precursor is adsorbed onto the substrate 10 through the deposition mask 11. In this regard, excess precursor is not adsorbed. The excess precursor is incompletely chemically adsorbed onto the substrate 10, and is only physically attached thereto. In this state, the first spraying unit 110 sprays an inert gas through the gas spraying unit 112 while scan-moving, and the excess precursor which is not adsorbed and only physically attached to the substrate 10 is separated from the substrate 10 and scattered in the chamber 130 (block 502). When the chamber 130 is exhausted by using the exhaustion unit 140, the scattered excess precursor is completely exhausted to the outside (block 503). After the exhaustion, the interior of the chamber 130 is cleaned, and in this state, the second spraying unit 120 moves in the Y direction while scanning. The second spraying unit 120 sprays a reactant through the source spraying unit 121 while moving back and forth above the substrate 10 in the Y direction (block 504). Since the non-adsorbed precursor is entirely exhausted from the chamber 130 through the exhaustion process, the sprayed reactant accurately reacts with the precursor adsorbed onto the substrate 10 to form a target atomic layer (block 505), and unintended generation of microparticles due to the reaction between the reactant and the non-adsorbed precursor is prevented. Subsequently, to remove excess reactant, an inert gas, such as argon, is sprayed onto the substrate 10 through the gas spraying unit 122 of the second spraying unit 120 (block 506), and then the exhaustion unit 140 is driven so as to exhaust the interior of the chamber 130 (block 507). The interior of the chamber 130 is cleaned by removing the excess deposition source, and in this clean state, the first spraying unit 110 is used to form a next atomic layer. Before the deposition begins, a user may select deposition modes of the first spraying unit 110 and the second spraying unit 120 from among a full mode and a half mode so as to set deposition amounts of the precursor and the reactant.

By doing so, a plurality of layers may be accurately formed, and problems occurring due to the excess deposition sources during deposition may be prevented.

Figure 2A:
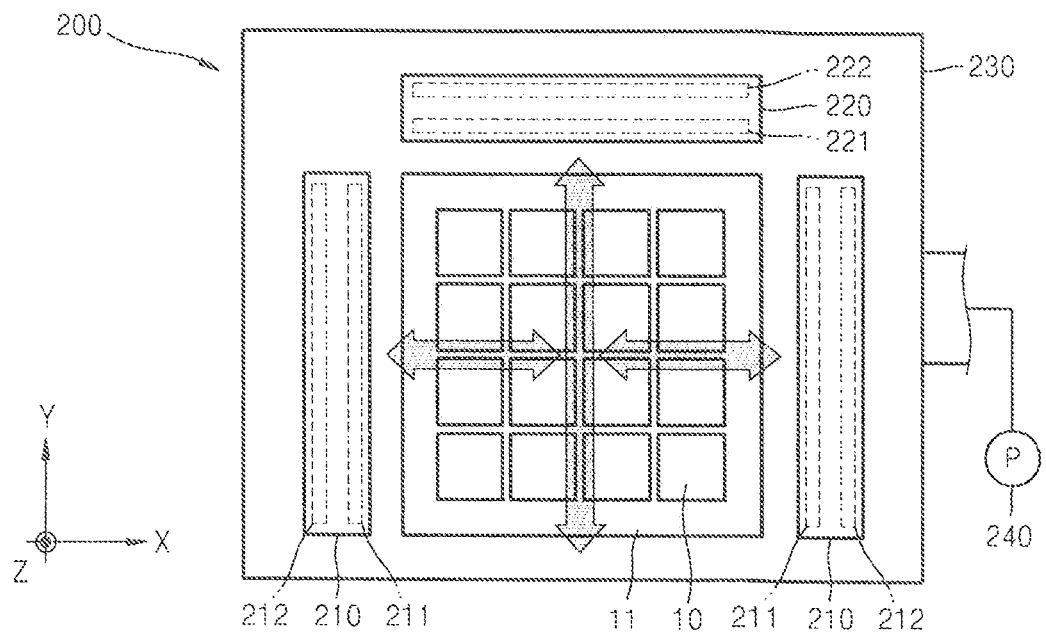
FIGS. 2A and 2B are views of a thin film deposition apparatus according to a second embodiment of the present invention.
Figure 2B:
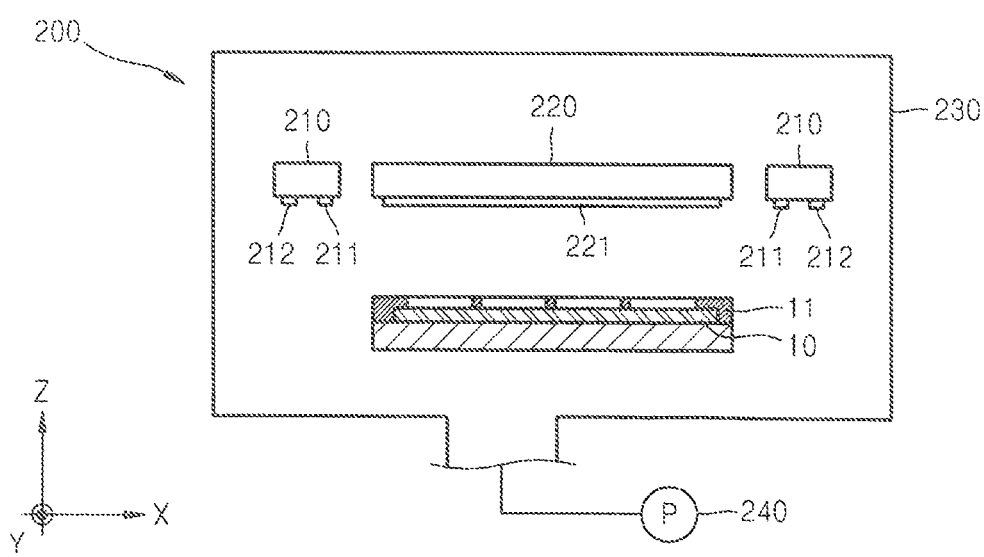

FIGS. 2A and 2B are views of a thin film deposition apparatus according to a second embodiment of the present invention, and FIG. 5 is a flowchart of a process performed in accordance with the present invention.

As illustrated, the thin film deposition apparatus 200 according to the present embodiment includes a chamber 230 in which a substrate 10, on which deposition is to be performed, is fixed in place, first and second spraying units 210 and 220, respectively, that spray a deposition source while scan-moving above the substrate 10 in the chamber 230, and an exhaustion unit 240 that exhausts the interior of the chamber 230, etc.

In this regard, the first spraying unit 210 and the second spraying unit 220 are separated from each other, wherein each of the first and second spraying units 210 and 220, respectively, independently performs its scanning operation, and scanning directions thereof run across each other. That is, the first spraying unit 210 scans the substrate 10 while the first spraying unit 210 moves back and forth along an X-axis direction, and the second spraying unit 220 scans the substrate 10 while moving back and forth along a Y-axis direction. Also, during scanning, the first spraying unit 210 sprays a precursor, which is a first deposition source, onto the substrate 10, and the second spraying unit 220 sprays a reactant, which is a second deposition source, onto the substrate 10. That is, a precursor and a reactant, which are used for ALD, are separately sprayed by using the first spraying unit 210 and the second spraying unit 220, respectively, which are separately driven. In the present second embodiment, unlike the previous first embodiment, the first spraying unit 210 consists of a pair of units facing each other. In this regard, the units of the first spraying unit 210 are assigned halves of the substrate 10 and simultaneously perform the scanning. By doing so, the deposition time may be reduced compared to that according to the previous first embodiment. Although in the present second embodiment, the first spraying unit 210 is embodied as two units, according to another embodiment, the second spraying unit 220 may also be embodied as two units.

Reference numerals 211 and 221 respectively denote a source spraying unit for spraying a precursor, which is a deposition source, and a source spraying unit for spraying a reactant, and reference numerals 212 and 222 each denote a gas spraying unit for spraying an inert gas, such as argon (Ar).

Referring to FIG. 5, the thin film deposition apparatus 200 may be operated as follows.

First, the substrate 10 is mounted together with the deposition mask 11 in the chamber 230 (block 500).

When the substrate 10 is completely mounted, the first and second spraying units 210 and 220, respectively, are driven. In this case, the first and second spraying units 210 and 220, respectively, alternately perform the scanning in the crossing directions, and as soon as one spraying unit selected from the first and second spraying units 110 and 120, respectively, completely performs deposition and exhaustion processes, the other one begins a deposition process.

That is, first, while the pair of first spraying units 210 are simultaneously driven in the X direction, a precursor as a deposition source is sprayed onto the substrate 10 through the source spraying unit 211 (block 501). Then, the sprayed precursor is adsorbed onto the substrate 10 through the deposition mask 11. In this regard, excess precursor is not adsorbed. The excess precursor is incompletely chemically adsorbed onto the substrate 10, and is only physically attached thereto. In this state, the first spraying units 210 spray an inert gas through the gas spraying unit 212 while scan-moving, and the excess precursor which is not adsorbed and only physically attached to the substrate 10 is separated from the substrate 10 and is scattered in the chamber 230 (block 502). In this case, when the chamber 230 is exhausted by using the exhaustion unit 240, the scattered excess precursor is completely exhausted to the outside (block 503). After the exhaustion, the interior of the chamber 230 is cleaned, and in this state, the second spraying unit 220 moves in the Y direction while scanning. The second spraying unit 220 sprays a reactant through the source spraying unit 221 while moving back and forth above the substrate 10 in the Y direction (block 504). Since the non-adsorbed precursor is entirely exhausted from the chamber 230 through the exhaustion process, the sprayed reactant accurately reacts with the precursor adsorbed onto the substrate 10 to form a target atomic layer (block 505), and unintended generation of microparticles due to the reaction between the reactant and the non-adsorption precursor is prevented. Subsequently, to remove excess reactant, an inert gas, such as argon, is sprayed onto the substrate 10 through the gas spraying unit 222 of the second spraying unit 220 (block 506), and then the exhaustion unit 240 is driven so as to exhaust the interior of the chamber 230 (block 50). The interior of the chamber 230 is cleaned by removing the excess deposition source therefrom, and in this clean state, the first spraying unit 210 is used to form a next atomic layer. Before the deposition begins, a user may select deposition modes of the first spraying unit 210 and the second spraying, unit 220 from among a full mode and a half mode so as to set deposition amounts of the precursor and the reactant.

Similar to the previous first embodiment, by doing so, a plurality of layers may be accurately formed, and problems occurring due to the excess deposition sources during deposition may be prevented.

Figure 3A:
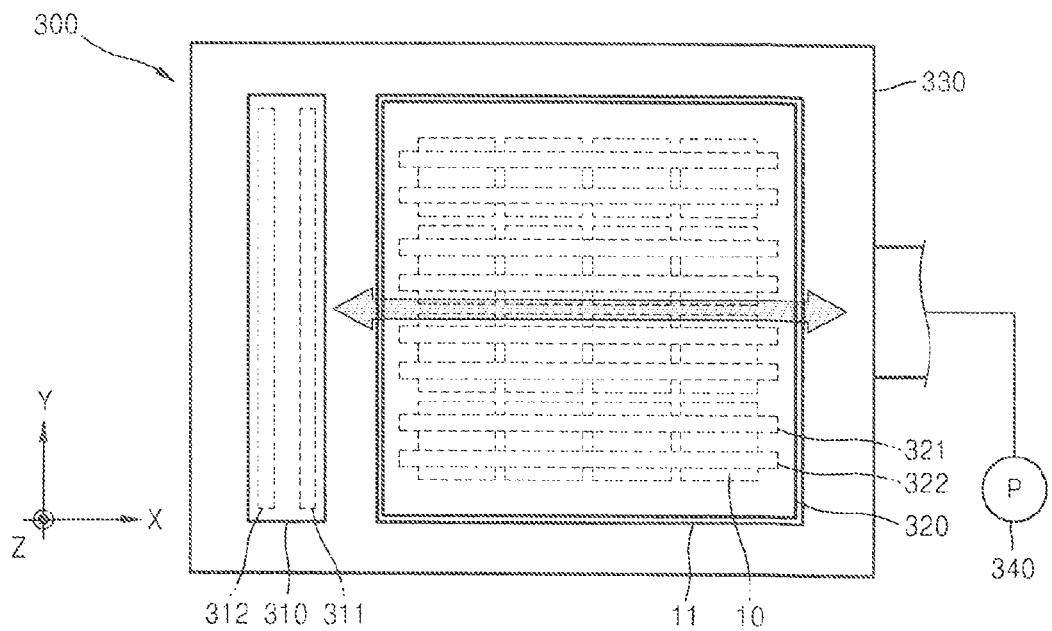
FIGS. 3A and 3B are views of a thin film deposition apparatus according to a third embodiment of the present invention.
Figure 3B:
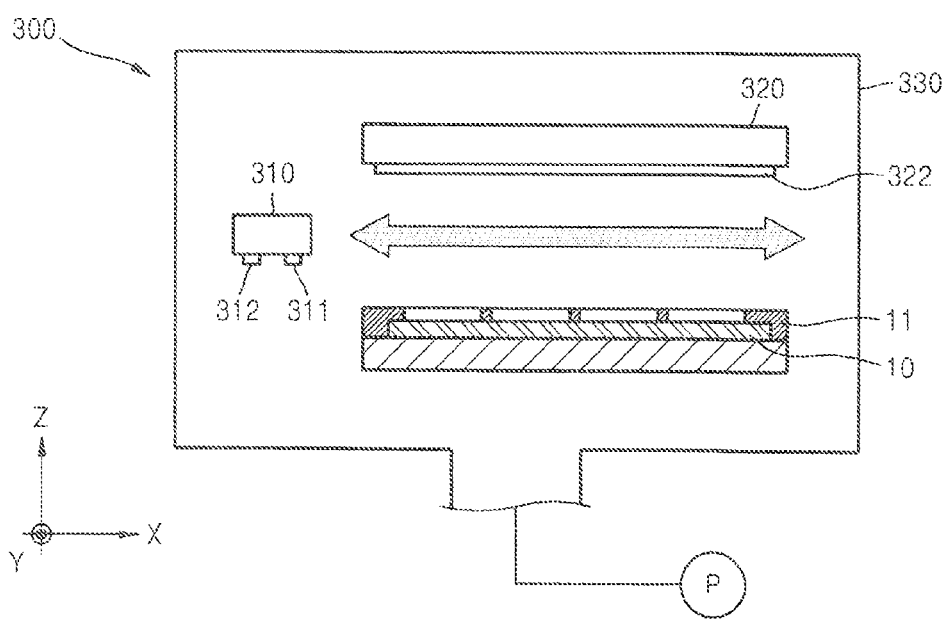

FIGS. 3A and 3B are views of a thin film deposition apparatus according to a third embodiment of the present invention, and FIG. 5 is a flowchart of a process performed in accordance with the present invention.

As illustrated, the thin film deposition apparatus 300 according to the present embodiment includes a chamber 330 in which a substrate 10, on which deposition is to be performed, is fixed in place, first and second spraying units 310 and 320, respectively, which spray a deposition source while scan-moving above the substrate 10 in the chamber 330, and an exhaustion unit 340 which exhausts the interior of the chamber 330, etc.

In this regard, the first spraying unit 310 and the second spraying unit 320 are separately arranged. The first spraying unit 310 may spray a precursor onto the substrate 10 while moving back and forth along an X-axis direction, and the second spraying unit 320 sprays a reactant onto the substrate 10 while being fixed in the chamber 330.

Reference numerals 311 and 321 respectively denote a source spraying unit for spraying a precursor, which is a deposition source, and a source spraying unit for spraying a reactant, and reference numerals 312 and 322 each denote a gas spraying unit for spraying an inert gas, such as argon (Ar).

Referring to FIG. 5, the thin film deposition apparatus 300 may be operated as follows.

First, the substrate 10 is mounted together with the deposition mask 11 in the chamber 330 (block 500).

When the substrate 10 is completely mounted, the first and second spraying units 310 and 320, respectively, are driven. In this case, the first and second spraying units 310 and 320, respectively, are alternately driven, and as soon as one spraying unit selected from the first and second spraying units 310 and 320, respectively, completely performs deposition and exhaustion processes, the other one begins a deposition process.

That is, first, while the first spraying unit 310 is driven in the X direction, a precursor as a deposition source is sprayed onto the substrate 10 through the source spraying unit 311 (block 501). Then, the sprayed precursor is adsorbed onto the substrate 10 through the deposition mask 11. In this regard, the excess precursor is not adsorbed. The excess precursor is incompletely chemically adsorbed onto the substrate 10, and is only physically attached thereto. In this state, the first spraying units 310 spray an inert gas through the gas spraying unit 312 while scan-moving, and the excess precursor which is not adsorbed and only physically attached to the substrate 10 is separated from the substrate 10 and scattered in the chamber 330 (block 502). In this case, when the chamber 330 is exhausted by using the exhaustion unit 340, the scattered excess precursor is completely exhausted toward the outside (block 503). After the exhaustion, the interior of the chamber 330 is cleaned, and in this state, driving of the second spraying unit 320 begins. The second spraying unit 320 sprays a reactant on the entire surface of the substrate 10 through the source spraying unit 321 while the second spraying unit 320 is fixed on the substrate 10 in the Y direction (block 504). Since the non-adsorbed precursor is entirely exhausted from the chamber 330 through the exhaustion process, the sprayed reactant accurately reacts with the precursor adsorbed onto the substrate 10 so as to form an intended atomic layer (block 505), and unintended generation of microparticles due to the reaction between the reactant and the non-adsorbed precursor is prevented. Subsequently, to remove excess reactant, an inert gas, such as argon, is sprayed onto the substrate 10 through the gas spraying unit 322 of the second spraying unit 320 (block 506), and then the exhaustion unit 340 is driven to exhaust the interior of the chamber 330 (block 507). The interior of the chamber 330 is cleaned by removing the excess deposition source so that the chamber 330 is in a clean state, and in this state, the first spraying unit 310 is used to form a next atomic layer. Before the deposition begins, a user may select deposition modes of the first spraying unit 310 and the second spraying unit 320 from among a full mode and a half mode so as to set deposition amounts of the precursor and the reactant.

By doing so, a plurality of layers may be accurately formed, and problems occurring due to the excess deposition sources during deposition may be prevented.

Figure 4A:
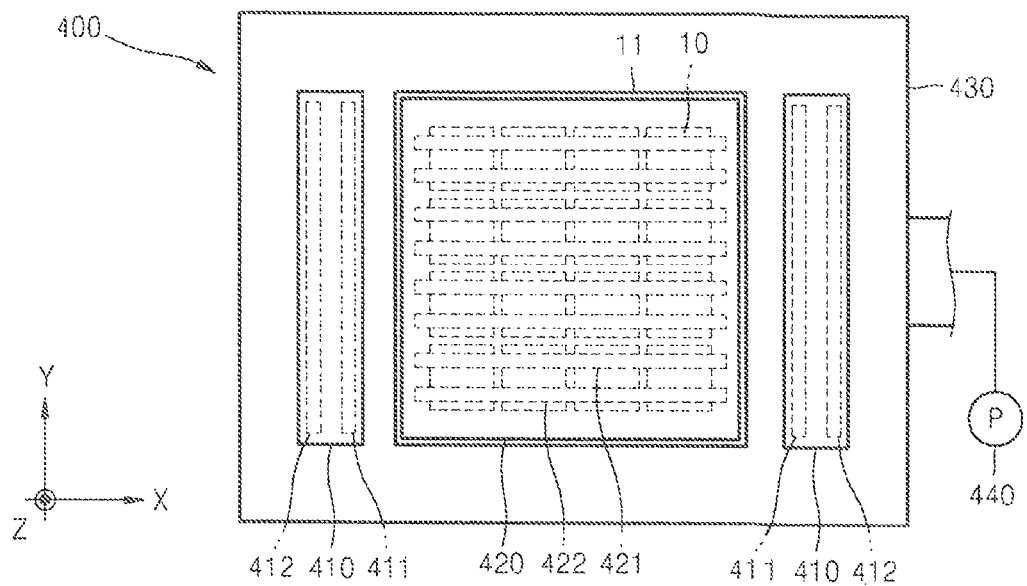
FIGS. 4A and 4B are views of a thin film deposition apparatus according to a fourth embodiment of the present invention.
Figure 4B:
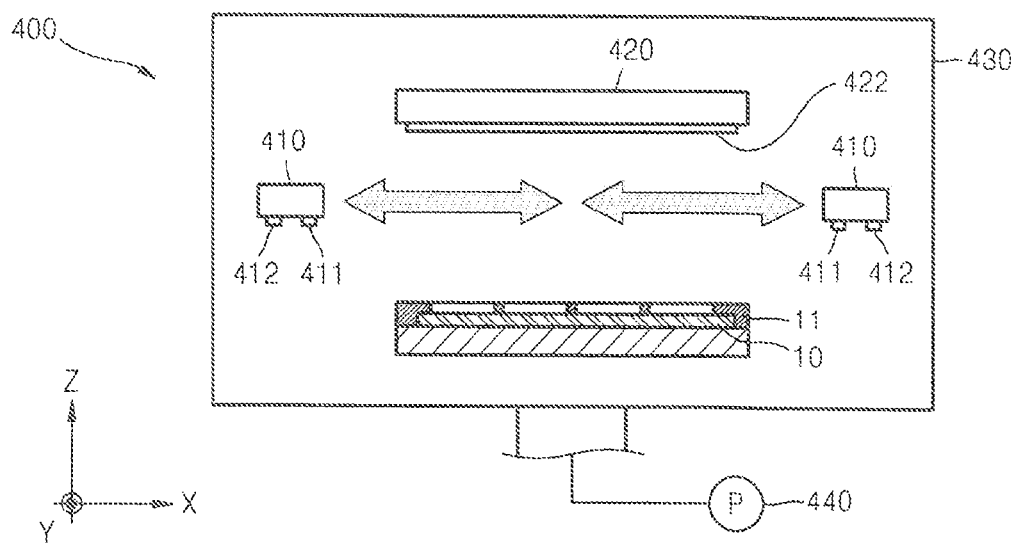

FIGS. 4A and 4B are views of a thin film deposition apparatus according to another embodiment of the present invention, and FIG. 5 is a flowchart of a process performed in accordance with the present invention.

As illustrated, the thin film deposition apparatus 400 according to the present embodiment includes a chamber 430 in which a substrate 10, on which deposition is performed, is fixed in place, first and second spraying units 410 and 420, respectively, that spray a deposition source while scan-moving above the substrate 10 in the chamber 430, and an exhaustion unit 440 that exhausts the interior of the chamber 430, etc.

In this regard, the first spraying unit 410 and the second spraying unit 420 are separately arranged. The first spraying unit 410 may spray a precursor onto the substrate 10 while moving back and forth along an X-axis direction, and the second spraying unit 420 sprays a reactant onto the substrate 10 while being fixed in the chamber 430. The first spraying unit 410 consists of a pair of units which face each other, which are assigned halves of the substrate 10, and which scan their corresponding regions of the substrate 10.

Reference numerals 411 and 421 respectively denote a source spraying unit for spraying a precursor, which is a deposition source, and a source spraying unit for spraying a reactant, and reference numerals 412 and 422 each denote a gas spraying unit for spraying an inert gas, such as argon (Ar).

Referring to the thin film deposition apparatus 400 may be operated as follows.

First, the substrate 10 is mounted together with the deposition mask 11 in the chamber 430 (block 500).

When the substrate 10 is completely mounted, the first and second spraying units 410 and 420, respectively, are driven. In this case, the first and second spraying units 410 and 420, respectively, are alternately driven, and as soon as one spraying unit selected from the first and second spraying units 410 and 420, respectively, completely performs deposition and exhaustion processes, the other one begins a deposition process.

That is, first, while the pair of first spraying units 410 are driven in the X direction, a precursor as a deposition source is sprayed onto the substrate 10 through the source spraying unit 411 (block 501). Then, the sprayed precursor is adsorbed o onto the substrate 10 through the deposition mask 11. In this regard, excess precursor is not adsorbed. The excess precursor is incompletely chemically adsorbed to the substrate 10, and is only physically attached thereto. In this state, while scan-moving, the first spraying units 410 spray an inert gas through the gas spraying unit 412, and the excess precursor, which is not adsorbed but only physically attached to the substrate 10, is separated from the substrate 10 and is scattered in the chamber 430 (block 502), in this ease, when the chamber 430 is exhausted by using the exhaustion unit 440, the scattered excess precursor is completely exhausted to the outside (block 503). After the exhaustion, the interior of the chamber 430 is cleaned, and in this state, driving of the second spraying unit 420 begins. The second spraying unit 420 sprays a reactant onto the entire surface of the substrate 10 through the source spraying unit 421 while the second spraying unit 420 is fixed on the substrate 10 in the Y direction (block 504). Since the non-adsorbed precursor is entirely exhausted from the chamber 430 through the exhaustion process, the sprayed reactant accurately reacts with the precursor adsorbed onto the substrate 10 so as to form a target atomic layer (block 505), and unintended generation of microparticles due to the reaction between the reactant and the non-adsorbed precursor is prevented. Subsequently, to remove excess reactant, an inert gas, such as argon, is sprayed onto the substrate 10 through the gas spraying unit 422 of the second spraying unit 420 (block 506), and then the exhaustion unit 440 is driven to exhaust the interior of the chamber 430 (block 507). The interior of the chamber 430 is cleaned by removing the excess deposition source so that the chamber 430 is in a clean state, and in this state, the first spraying unit 410 is used to form a next atomic layer. Before the deposition begins, a user may select deposition modes of the first spraying unit 410 and the second spraying unit 420 from among a full mode and a half mode so as to set deposition amounts of the precursor and the reactant.

By doing so, a plurality of layers may be accurately formed, and problems occurring due to the excess deposition sources during deposition may be prevented.

As described above, when a thin film deposition apparatus is used, the unintended generation of microparticles during deposition is sufficiently suppressed. Accordingly, when an ALD process is performed by using the thin film deposition apparatus, a thin film may be accurately formed.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A thin film deposition apparatus, comprising:
   a chamber in which a substrate is placed;
   a first spraying unit for spraying a first deposition source onto the substrate; and
   a second spraying unit for spraying a second deposition source onto the substrate;
   wherein the first spraying unit and the second spraying unit are separately driven in the chamber; and
   wherein the first spraying unit and the second spraying unit scan the substrate during deposition, and wherein a scanning direction of the first spraying unit and a scanning direction of the second spraying unit run across each other.

2. The thin film deposition apparatus of claim 1, wherein each of the first spraying unit and the second spraying unit comprises a gas spraying unit for spraying an inert gas on the substrate.

3. The thin film deposition apparatus of claim 1, wherein any one of the first spraying unit and the second spraying unit comprises a pair of units facing each other.

4. The thin film deposition apparatus of claim 1, further comprising an exhaustion unit for exhausting the interior of the chamber.

5. The thin film deposition apparatus of claim 1, wherein the first deposition source comprises a precursor, and the second deposition source comprises a reactant.

6. A thin film deposition apparatus for practicing a thin film deposition method comprising the steps of:
   preparing a chamber and placing a substrate in the chamber;
   executing a first deposition process to sequentially spray a first deposition source and an inert gas on the substrate;
   exhausting the chamber to remove excess first deposition source that is not adsorbed onto the substrate;

executing a second deposition process to sequentially spray a second deposition source and an inert gas on the substrate; and exhausting the chamber to remove excess second deposition source that is not adsorbed onto the substrate;

the thin film deposition apparatus comprising the chamber, the substrate placed in the chamber, means for supplying the inert gas, and means for exhausting the chamber;

wherein the thin film deposition apparatus further comprises a first spraying unit positioned to spray the first deposition source onto the substrate, and a second spraying unit positioned to spray the second deposition source onto the substrate, the first spraying unit and the second spraying unit being separately driven in the chamber; and wherein the first spraying unit and the second spraying unit are disposed to scan the substrate during spraying of the first deposition source and spraying of the second deposition source, and a scanning direction of the first spraying unit and a scanning direction of the second spraying unit run across each other.

7. A thin film deposition apparatus for practicing a thin film deposition method as recited in claim 6, the method further comprising the step of selecting a deposition mode of the first deposition source and the second deposition source from one of a full mode and a half mode so as to set spraying amounts of deposition sources.

* * * * *